US012751338B2

(12) United States Patent
Baik

(10) Patent No.: US 12,751,338 B2
(45) Date of Patent: Sep. 29, 2026

(54) PACKAGED INTEGRATED CIRCUIT DEVICES WITH ENHANCED DAM STRUCTURES THAT PROVIDE INCREASED YIELD AND RELIABILITY

(71) Applicant: Samsung Electronics Co., Ltd., Suwon-si (KR)

(72) Inventor: Seunghyun Baik, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 441 days.

(21) Appl. No.: 18/475,530

(22) Filed: Sep. 27, 2023

(65) Prior Publication Data

US 2024/0355777 A1 Oct. 24, 2024

(30) Foreign Application Priority Data

Apr. 19, 2023 (KR) ........................ 10-2023-0051102

(51) Int. Cl.

| | |
|---|---|
| ***H10W 90/00*** | (2026.01) |
| ***H10W 72/30*** | (2026.01) |
| ***H10W 74/10*** | (2026.01) |
| ***H10W 74/15*** | (2026.01) |
| ***H10W 90/24*** | (2026.01) |

(52) U.S. Cl.

CPC .......... *H10W 90/00* (2026.01); *H10W 74/117* (2026.01); *H10W 72/387* (2026.01); *H10W 74/15* (2026.01); *H10W 90/24* (2026.01); *H10W 90/724* (2026.01); *H10W 90/734* (2026.01); *H10W 90/754* (2026.01)

(58) Field of Classification Search

None

See application file for complete search history.

(56) References Cited

U.S. PATENT DOCUMENTS 6,614,122 B1 9/2003 Dory et al.
7,999,368 B2 * 8/2011 Yim ...................... H10W 90/00
438/109

(Continued)

FOREIGN PATENT DOCUMENTS

JP 2021093435 A 6/2021

*Primary Examiner* — Nishath Yasmeen
(74) *Attorney, Agent, or Firm* — Wolf, Greenfield & Sacks, P.C.

(57) ABSTRACT

A semiconductor package includes a substrate, a first semiconductor chip on an upper surface of the substrate, and electrically conductive bumps extending between and electrically connected to the substrate and the first semiconductor chip. A non-conductive film layer is provided, which has at least a portion extending between the electrically conductive bumps. A second semiconductor chip is provided, which extends on the upper surface of the substrate. Electrically conductive wires are provided that electrically connect respective portions of the second semiconductor chip to respective portions of the upper surface of the substrate. In addition, the upper surface of the substrate includes a dam, which protrudes between one of: (i) a region overlapping the second semiconductor chip, and (ii) a region connected to the wires and a region overlapping the first semiconductor chip. The upper surface of the substrate may also include a trench recessed alongside at least a portion of the dam.

19 Claims, 12 Drawing Sheets

(56) References Cited

U.S. PATENT DOCUMENTS

| | | | | |
|---|---|---|---|---|
| 8,399,300 | B2 * | 3/2013 | Lee | H10W 74/012<br>257/E21.511 |
| 8,693,211 | B2 | 4/2014 | Tamadate | |
| 8,952,552 | B2 | 2/2015 | Zang et al. | |
| 9,041,205 | B2 | 5/2015 | Karhade et al. | |
| 10,923,438 | B2 * | 2/2021 | Tsai | H10W 20/023 |
| 11,114,358 | B2 | 9/2021 | Hong et al. | |
| 11,437,293 | B2 * | 9/2022 | Kim | H10W 74/012 |
| 2011/0115083 | A1 * | 5/2011 | Zang | H10W 74/012<br>257/E23.116 |
| 2011/0260338 | A1 | 10/2011 | Lee et al. | |
| 2019/0326234 | A1 * | 10/2019 | Benson | H10W 44/20 |
| 2021/0057299 | A1 * | 2/2021 | Hong | H10W 74/10 |

* cited by examiner

I2-I2'

PACKAGED INTEGRATED CIRCUIT DEVICES WITH ENHANCED DAM STRUCTURES THAT PROVIDE INCREASED YIELD AND RELIABILITY

REFERENCE TO PRIORITY APPLICATION

This application claims priority to Korean Patent Application No. 10-2023-0051102, filed Apr. 19, 2023, the disclosure of which is hereby incorporated herein by reference.

BACKGROUND

The present inventive concept relates to packaged integrated circuit devices.

Recently, semiconductor packages mounted in electronic devices have been required to have high performance and high capacity. Accordingly, a semiconductor package including a plurality of semiconductor chips and a control chip controlling operations of the semiconductor chips, has been developed.

SUMMARY

The present inventive concept provides a semiconductor package capable of efficiently improving performance relative to a unit size and ensuring durability and/or reliability.

According to an aspect of the present inventive concept, there is provided a semiconductor package including: a substrate, a first semiconductor chip disposed on an upper surface of the substrate, bumps disposed between and connected to the substrate and the first semiconductor chip, a non-conductive film layer having at least a portion disposed between the bumps, a second semiconductor chip disposed on the upper surface of the substrate, and wires connecting between the second semiconductor chip and the upper surface of the substrate. The upper surface of the substrate may have a dam protruding between a region overlapping the second semiconductor chip (or a region connected to the wires) and a region overlapping the first semiconductor chip, and a trench recessed alongside at least a portion of the dam.

According to another aspect of the present inventive concept, there is provided a semiconductor package including: a substrate, a first semiconductor chip disposed on an upper surface of the substrate, bumps disposed between and connected to the substrate and the first semiconductor chip, a non-conductive film layer having at least a portion disposed between the bumps, second semiconductor chips disposed on the upper surface of the substrate, and wires connecting one of the second semiconductor chips and the upper surface of the substrate. The upper surface of the substrate may have a dam protruding between a region overlapping the other one of the second semiconductor chips and a region overlapping the first semiconductor chip and protruding between a region connected to the wires and the region overlapping the first semiconductor chip, and a trench recessed alongside at least a portion of the dam.

According to another aspect of the present inventive concept, there is provided a semiconductor package including: a substrate, first and second semiconductor chips disposed on an upper surface of the substrate, bumps disposed between and connected to the substrate and the first semiconductor chip, and a non-conductive film layer having at least a portion disposed between the bumps. The upper surface of the substrate may have a dam protruding and having a shape extending to surround a region overlapping the first semiconductor chip, and a trench recessed and having a shape extending partially alongside portion of the dam.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1A:
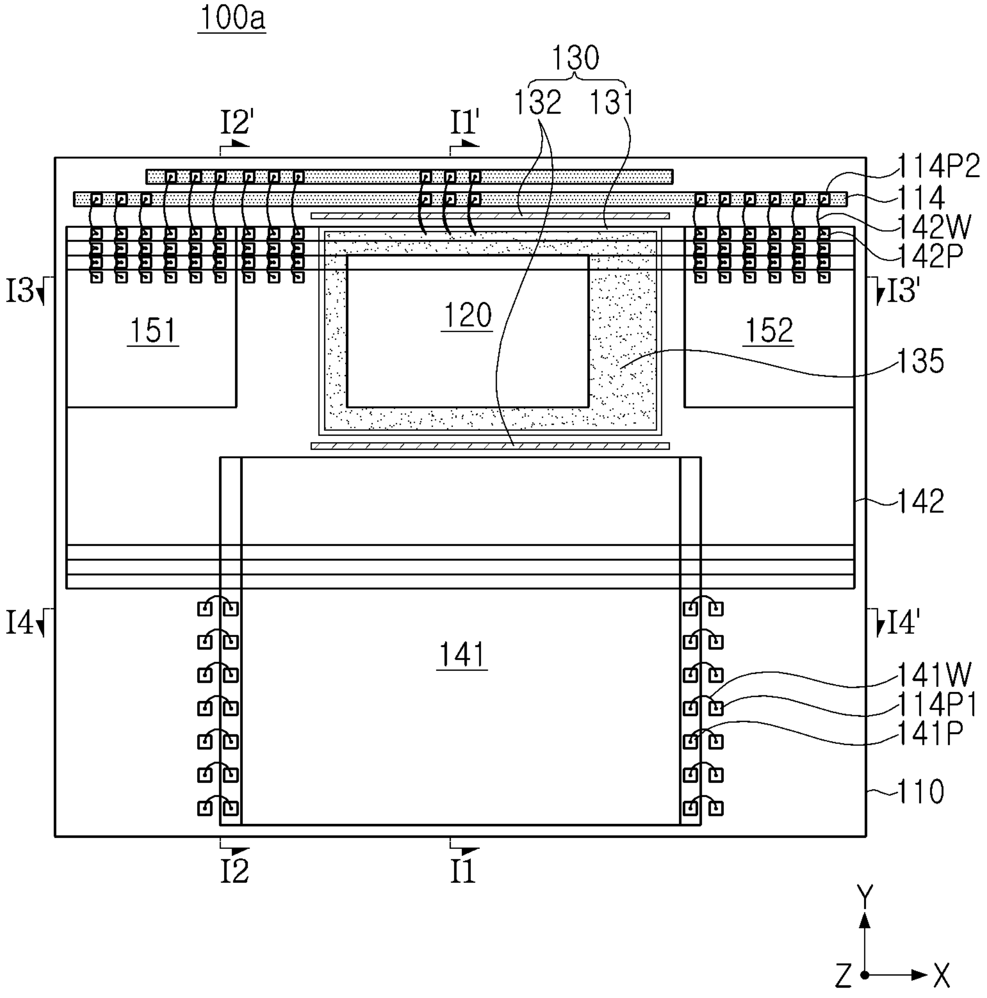
FIGS. 1A to 1E are plan views of a semiconductor package according to an example embodiment of the present inventive concept.

Detailed description of the present inventive concept to be set forth below refers to the accompanying drawings which, by way of example, illustrate specific example embodiments in which the present inventive concept may be practiced. The example embodiments are described in sufficient detail to enable one skilled in the art to practice the present inventive concept. It should be understood that the various example embodiments of the present inventive concept are different from each other but are not necessarily mutually exclusive. For example, one example embodiment of specific shapes, structures, and characteristics described herein may be implemented in another example embodiment without departing from the spirit and scope of the present inventive concept. Additionally, it should be understood that the location or arrangement of individual components within each disclosed example embodiment may be changed without departing from the spirit and scope of the present inventive concept. Accordingly, the detailed description set forth below is not intended to be taken in a limiting sense, and the scope of the present inventive concept is limited only by the appended claims, with all equivalents as claimed by those claims. Like reference numbers in the drawings indicate the same or similar function throughout the various aspects.

Hereinafter, example embodiments of the present inventive concept will be described in detail with reference to the accompanying drawings, such that those skilled in the art could easily carry out the present inventive concept.

Figure 2A:
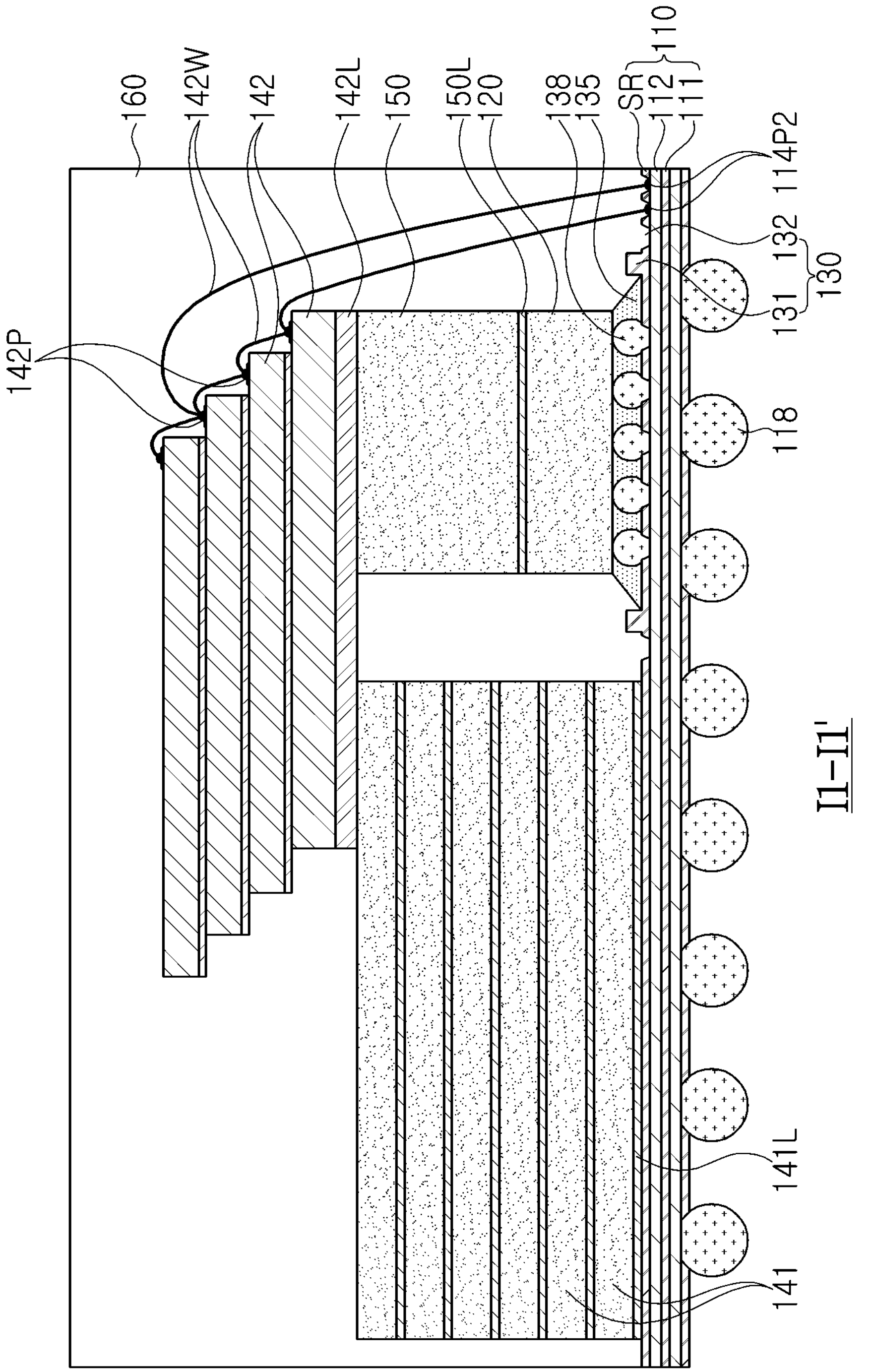
FIGS. 2A to 2D are cross-sectional views of a semiconductor package according to an example embodiment of the present inventive concept.
Figure 2B:
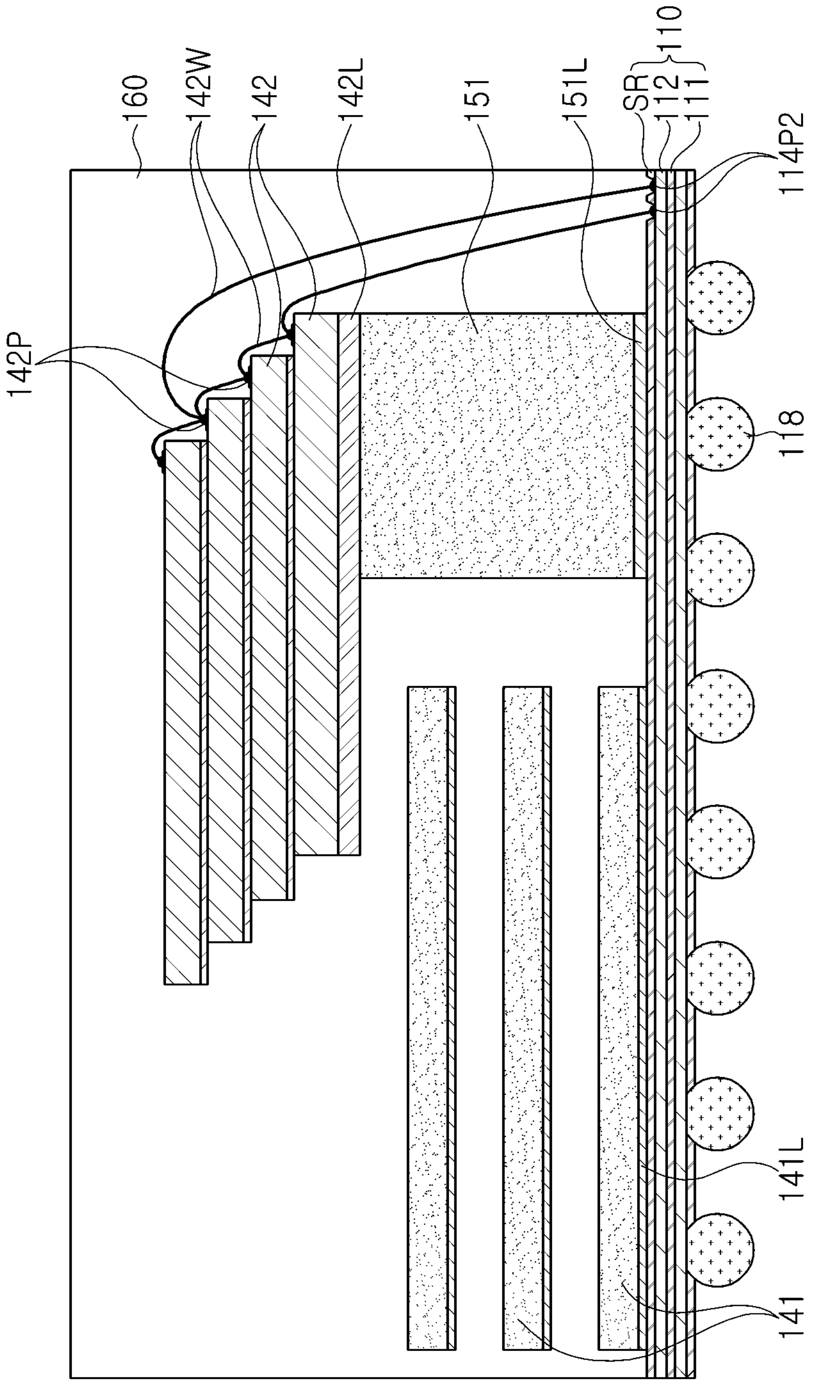
Figure 2C:
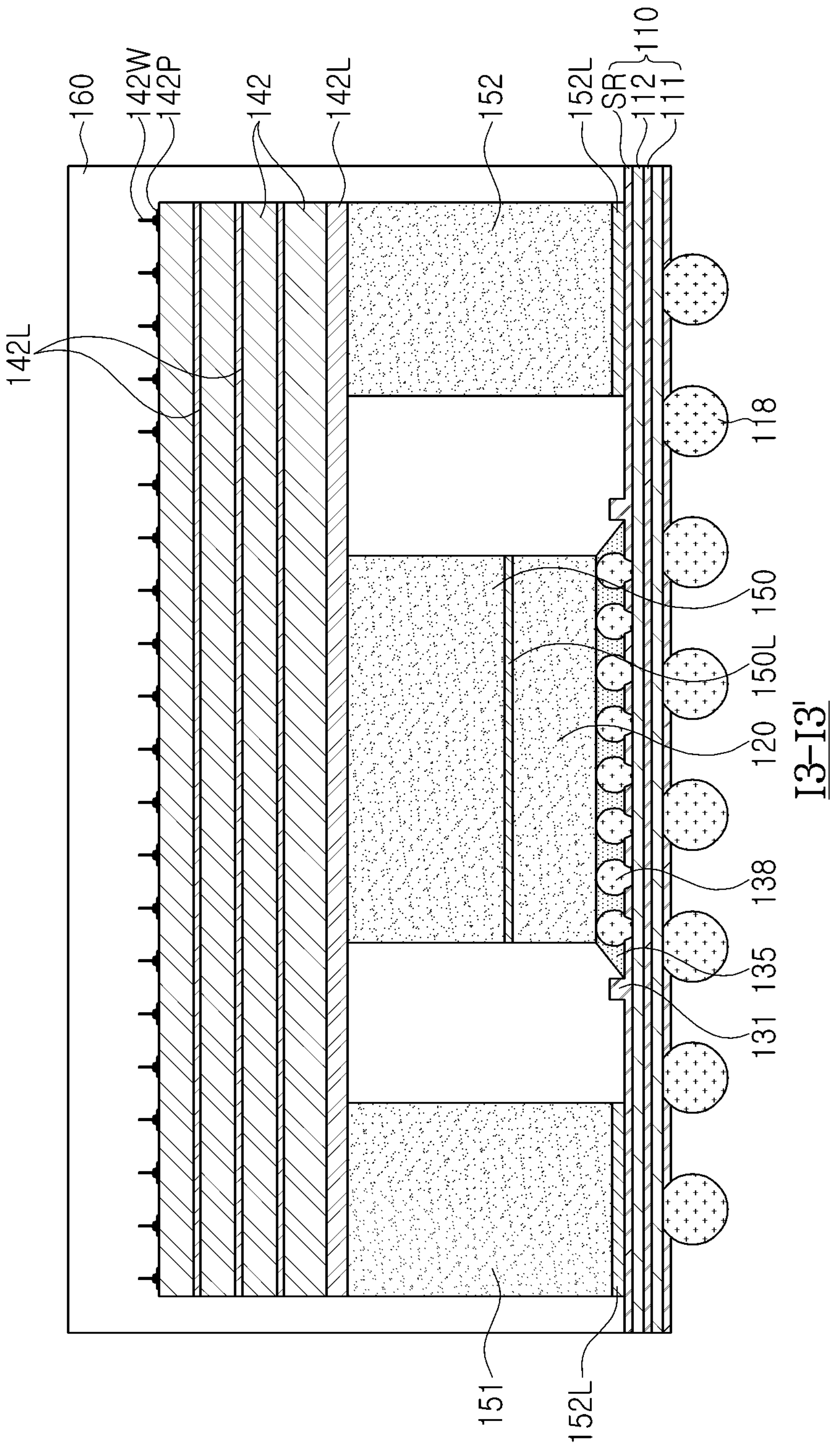
Figure 2D:
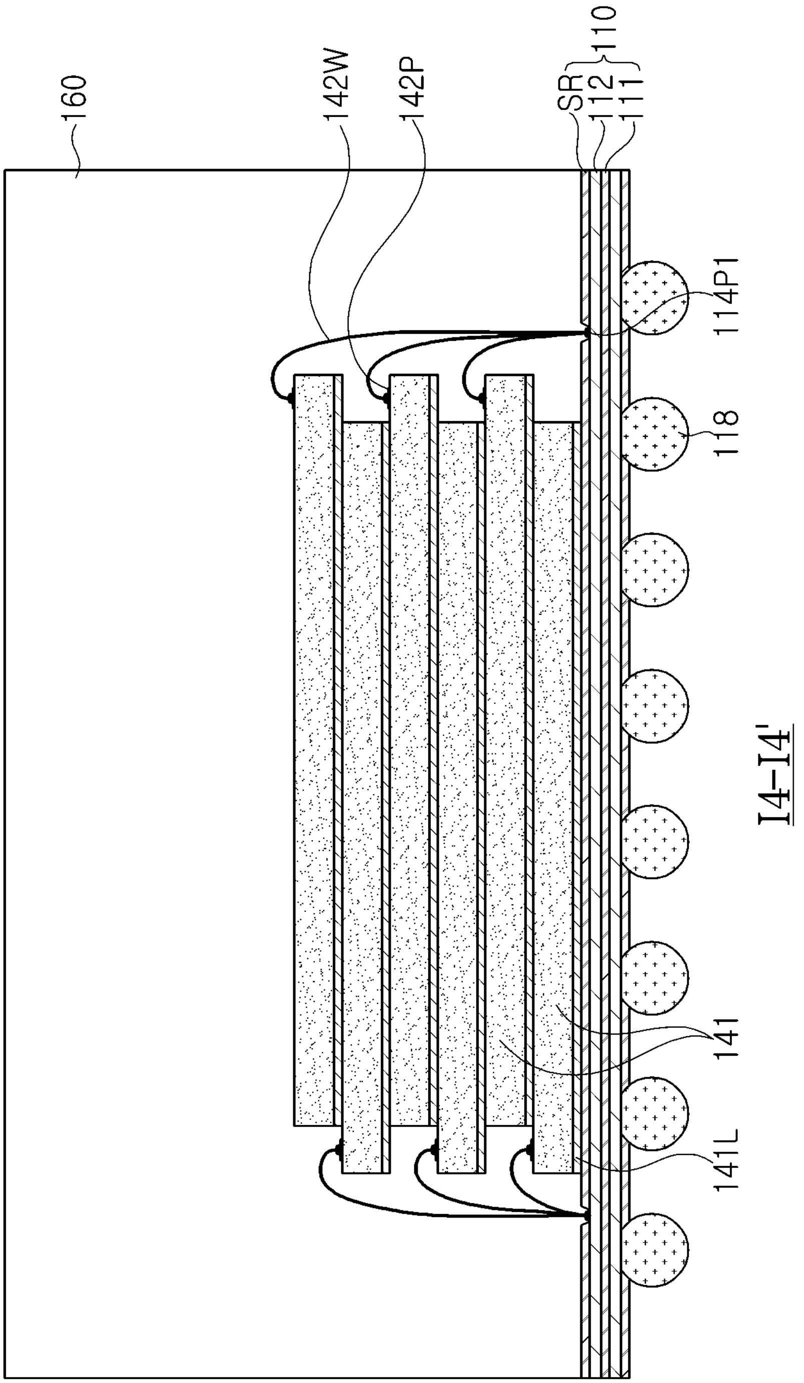

A cross-section I1-I1' of FIG. 2A is a cross-section of a semiconductor package 100*a* of FIG. 1A taken along a Y-Z plane from I1 to I1'. A cross-section I2-I2' of FIG. 2B is a cross-section of a semiconductor package 100*a* of FIG. 1A taken along a Y-Z plane from I2 to I2'. A cross-section I3-I3' of FIG. 2C is a cross-section of a semiconductor package 100*a* of FIG. 1A taken along an X-Z plane from I3 to I3'. A cross-section I4-I4' of FIG. 2D is a cross-section of a semiconductor package 100*a* of FIG. 1A taken along an X-Z plane from I4 to I4'. For example, the semiconductor package 100*a* may be a system in package (SIP) including two or more semiconductor chips and may be a portion of a package on package (POP) structure.

Referring to FIGS. 1A, 2A, 2B, 2C, and 2D, the semiconductor package 100*a* according to an example embodiment may include a substrate 110, a first semiconductor chip 120, bumps 138, and a non-conductive film layer 135. The substrate 110 may have a structure in which at least one insulating layer 111 and at least one interconnection layer 112 are alternately stacked. The substrate 110 may be a printed circuit board, and the number of the at least one insulating layer 111 and the number of the at least one interconnection layer 112 are not particularly limited. The at least one interconnection layer 112 may include interconnections extending in a horizontal direction. The at least one insulating layer 111 may include conductive vias, vertically passing therethrough. The interconnections and the conductive vias may be connected to each other, and may form electrical connection paths. The electrical connection paths may include a conductive material, for example, copper (Cu), aluminum (Al), silver (Ag), tin (Sn), gold (Au), nickel (Ni), lead (Pb), titanium (Ti), or alloys thereof.

The at least one insulating layer 111 may include an insulating material, and may include, for example, a thermosetting resin such as an epoxy resin or a thermoplastic resin such as polyimide. For example, the at least one insulating layer 111 may include a photosensitive insulating material such as photo imageable dielectric (PID) resin. Alternatively, the at least one insulating layer 111 may include a resin mixed with an inorganic filler, for example, an Ajinomoto build-up film (ABF). Alternatively, at least one insulating layer 111 may include prepreg, flame retardant (FR-4), or bismaleimide triazine (BT). The at least one insulating layer 111 may include the same or different materials. Depending on a material, a process, and the like of respective layers, a boundary therebetween may not be easily distinguished.

The substrate 110 may further include a solder resist layer SR disposed on an upper surface of the substrate 110. The insulating material that may be contained in the at least one insulating layer 111 may also be contained in the solder resist layer SR, and a type or composition (for example, an inorganic filler content, an organic filler content, and the like) of the insulating material contained in the solder resist layer SR may be different from that of the at least one insulating layer 111, and a material, such as a photosensitive insulating material or the like, which is advantageous for forming openings in which the bumps 138 are disposed may be included.

The first semiconductor chip 120 may be disposed on the upper surface of the substrate 110. For example, the first semiconductor chip 120 may include connection pads disposed on a lower surface of the first semiconductor chip 120, and may be electrically connected to the substrate 110 through the connection pads. For example, the connection pads may include a conductive material such as tungsten (W), aluminum (Al), copper (Cu), or the like, and may be pads of a bare chip, for example, aluminum (Al) pads. However, in some example embodiments, the connection pads may be pads of a packaged chip, for example, copper (Cu) pads.

For example, the first semiconductor chip 120 may include a body portion containing a semiconductor material such as silicon (Si), germanium (Ge), gallium arsenide (GaAs), or the like, and a device layer disposed on a lower portion of the body portion, the device layer including an integrated circuit (IC). The first semiconductor chip 120 may include a logic semiconductor chip and/or a memory semiconductor chip. The logic semiconductor chip may be a microprocessor, for example, a central processing unit (CPU), a graphics processing unit (GPU), a field programmable gate array (FPGA), an application processor (AP), a digital signal processor, a cryptographic processor, a controller, or an application specific integrated circuit (ASIC). The memory semiconductor chip may be a volatile memory such as dynamic random access memory (DRAM), static random access memory (SRAM), or the like or a nonvolatile memory such as flash memory or the like.

The bumps 138 may be disposed between and connected to the substrate 110 and the first semiconductor chip 120. The first semiconductor chip 120 may be mounted on the upper surface of the substrate 110 through the bumps 138 in a flip-chip bonding manner. Accordingly, the first semiconductor chip 120 may be electrically connected to the electrical connection paths of the substrate 110. A portion of each of the bumps 138 may be inserted into openings of the solder resist layer SR, and may be connected to at least one interconnection layer 112 exposed through the openings. Substrate bumps 118, connected to a lower surface of the substrate 110, may also be implemented in a similar manner to the bumps 138.

For example, the bumps 138 may have a ball or column shape, and may include solder containing tin (Sn) or an alloy (Sn—Ag—Cu) including tin (Sn). The bumps 138 may have a relatively low melting point as compared to other metal materials, such that the connection pads of the first semiconductor chip 120 may be connected and fixed to the substrate pads of the substrate 110 using a thermal compression bonding (TCB) process or a reflow process.

At least a portion of the non-conductive film layer 135 may be disposed between the bumps 138, and may surround the bumps 138. The non-conductive film layer 135 may improve reliability of the bumps 138 by making them more resistant to stress. For example, the non-conductive film layer 135 may be formed using an underfill process, such that the non-conductive film layer 135 may be referred to as an underfill layer, may include a non-conductive polymer, and may include a non-conductive paste (NCP). When the non-conductive film layer 135 is formed, the non-conductive film layer 135 may have fluidity, such that a portion of the non-conductive film layer 135 may flow in a horizontal direction. In order to ensure reliability of the bumps 138, an overflow prevention unit 130 may prevent the non-conductive film layer 135 from overflowing in the horizontal direction.

Referring to FIGS. 1A, 2A, 2B, 2C, and 2D, the semiconductor package 100*a* according to an example embodiment of the present inventive concept may further include at least one of second semiconductor chips 141 and 142, and wires 141W and 142W. The second semiconductor chips 141 and 142 may be disposed on the upper surface of the substrate 110, and the wires 141W and 142W may connect the second semiconductor chips 141 and 142 to the upper surface of the substrate 110. Accordingly, the second semiconductor chips 141 and 142 may be connected to the upper surface of the substrate 110 in a wire bonding manner, rather than through bumps.

The second semiconductor chips 141 and 142 may be connected to wire bonding pads 114P1 and 114P2 on the upper surface of the substrate 110 through second semiconductor chip pads 141P and 142P on upper surfaces of the second semiconductor chips 141 and 142. The second semiconductor chip pads 141P and 142P may be electrically connected to a device layer including integrated circuits of the second semiconductor chips 141 and 142, and the wire bonding pads 114P1 and 114P2 may be electrically connected to at least one interconnection layer 112 of the substrate 110. For example, the wires 141W and 142W may contain a metal material having high conductivity, such as gold (Au), aluminum (Al), or copper (Cu), and may have a melting point higher than those of the bumps 138, but the present inventive concept is not limited thereto. At least a portion of the wire bonding pads 114P1 and 114P2 may be disposed in a region 114 connected to the wires on the upper surface of the substrate 110.

Each of the second semiconductor chips 141 and 142 may include two or more stacked sub-semiconductor chips. The adhesive films 141L and 142L may attach the sub-semiconductor chips to each other. A lowermost adhesive film, among the adhesive films 141L and 142L, may attach, to each other, the second semiconductor chip 141 and the solder resist layer SR on the upper surface of the substrate 110, and may attach, to each other, the second semiconductor chip 142 and a spacer 150 (and adhesive film 150L).

For example, one of the second semiconductor chips 142 may be a NAND flash memory semiconductor chip, the other one 141 of the second semiconductor chips may be a DRAM memory semiconductor chip, and the first semiconductor chip 120 may be a control semiconductor chip controlling the semiconductor chips 141 and 142 and may be electrically connected to the second semiconductor chips 141 and 142 through the substrate 110. For example, the first semiconductor chip 120 may determine a data processing sequence of sub-semiconductor chips of each of the second semiconductor chips 141 and 142, may perform a control operation for preventing errors and defective sectors, may include a buffer circuit for controlling loading of the sub-semiconductor chips, and may perform a frequency boosting interface (FBI) operation.

An area of the upper surface of the substrate 110 may be limited. Thus, when at least one of the second semiconductor chips 141 and 142 and the first semiconductor chip 120 are disposed together on one substrate 110, a separation distance between at least one of the second semiconductor chips 141 and 142 or the wires 141W and 142W and the first semiconductor chip 120 may decrease.

As the separation distance decreases, a distance between the first semiconductor chip 120 and the overflow prevention unit 130 may also decrease. As the distance between the first semiconductor chip 120 and the overflow prevention unit 130 decreases, the overflow prevention unit 130 may be required to have higher performance to block the non-conductive film layer 135.

If the non-conductive film layer 135 excessively overflows into the other one 141 of the second semiconductor chips, the non-conductive film layer 135 may affect adhesion between the other one 141 of the second semiconductor chips and an adhesive film 141L, such that the risk of detachment of the other one 141 of the second semiconductor chips may increase, or connection of the wires 141W to the second semiconductor chip pads 141P and the wire bonding pads 114P1 may have lowered reliability. If the non-conductive film layer 135 excessively overflows into a region 114 connected to wires connected to one 142 of the second semiconductor chips, connection reliability between the wires 142W and the wire bonding pads 114P2 may be lowered.

The upper surface of the substrate 110 of the semiconductor package 100*a* according to an example embodiment of the present inventive concept may have a dam 131 protruding between a region overlapping the second semiconductor chip 141 and/or a region 114 connected to the wires 142W and a region overlapping the first semiconductor chip 120, and a trench 135 recessed alongside at least a portion of the dam 131. The dam 131 may block the flow of the non-conductive film layer 135 in a horizontal direction, and the trench 132 may trap any portion of the non-conductive film layer 135 that overflows. Moreover, because the performance of the overflow prevention unit 130 to block the non-conductive film layer 135 may depend on a sum of a thickness of the dam 131 and a depth of the trench 132, an optimized combination of the dam 131 and the trench 132 may efficiently improve the performance of the overflow prevention unit 130 to block the non-conductive film layer 135.

Accordingly, the performance of the overflow prevention unit 130 to block the non-conductive film layer 135 may be efficiently improved, such that arrangement stability of the second semiconductor chip 141 may be improved and connection stability of the wires 142W may be improved without a substantial increase in the area of the upper surface of the substrate 110. Accordingly, the semiconductor package 100*a* may have efficiently improved performance relative to a unit size thereof, and durability and reliability of the semiconductor package 100*a* may also be ensured.

As shown, the dam 131 may have a shape extending to surround a region overlapping the first semiconductor chip 120, and the trench 132 may have a shape extending partially alongside a portion of the dam 131. For example, when a direction in which the region overlapping the first semiconductor chip 120 and the region overlapping the second semiconductor chip 141 and/or the region 114 connected to the wires 142W oppose each other is a Y-direction, the trench 132 may be disposed only to cover a portion of the dam 131, opposing the region overlapping the first semiconductor chip 120 in the Y-direction, and may not be disposed to cover the other portion of the dam 131, opposing the region overlapping the first semiconductor chip 120 in an X-direction. Accordingly, a flow direction of the non-conductive film layer 135 may be more concentrated in the X-direction than in the Y-direction, thereby more effectively suppressing overflow of the non-conductive film layer 135 into the region overlapping the second semiconductor chip 141 and/or the region 114 connected to the wires 142W.

Spacers 151 and 152, which oppose the region overlapping the first semiconductor chip 120 in the X-direction, may be dummy silicon spacer chips, such that overflow of the non-conductive film layer 135 in the X-direction may not substantially affect durability and reliability of the semiconductor package 100*a*. Even when the spacers 151 and 152 are replaced with additional semiconductor chips, a separation distance between the additional semiconductor chips and the first semiconductor chip 120 may be greater than a distance between the first semiconductor chip 120 and the second semiconductor chip 141, and may be greater than a distance between the first semiconductor chip 120 and the wires 142W, such that the non-conductive film layer 135 may not substantially affect reliability of the additional semiconductor chips.

For example, one 142 of the second semiconductor chips may be disposed on an upper surface of the first semiconductor chip 120, and the first semiconductor chip 120 may be disposed on a portion of the one 142 of the second semiconductor chips and the substrate 110, and the other one 141 of the second semiconductor chips may be disposed between the other portion of the one 142 of the second semiconductor chips and the substrate 110. Accordingly, the first semiconductor chip 120 and the second semiconductor chips 141 and 142 may be compactly disposed on a limited area of the upper surface of the substrate 110. The spacers 150, 151, and 152 may be disposed in an empty space corresponding to a thickness difference between the first semiconductor chip 120 and the second semiconductor chips 141 and 142, and thus may support the one 142 of the second semiconductor chips and may be dummy silicon spacer chips.

Thus, as the first semiconductor chip 120 and the second semiconductor chips 141 and 142 are compactly disposed, a distance between the first semiconductor chip 120 and the second semiconductor chip 141 and a distance between the first semiconductor chip 120 and the wires 142W may further decrease, and the overflow prevention unit 130 may be required to have higher performance to block the non-conductive film layer 135. A combined structure of the dam 131 and the trench 132 may efficiently improve the performance of the overflow prevention unit 130 to block the non-conductive film layer 135, thereby ensuring durability and reliability of the semiconductor package 100*a* and further improving miniaturization efficiency of the semiconductor package 100*a*. Alternatively, an allowable maximum volume of each of the second semiconductor chips 141 and 142 may be increased, thereby further increasing the performance of the second semiconductor chips 141 and 142, and more efficiently improving the performance of the semiconductor package 100*a* relative to a size of the semiconductor package 100*a*.

The semiconductor package 100*a* according to an example embodiment may further include an encapsulant 160 encapsulating the first and second semiconductor chips 120, 141, and 142. The encapsulant 160 may fill an empty space on the upper surface of the substrate 110, may provide an upper surface and a side surface of the semiconductor package 100*a*, and may improve durability (for example, robustness against external impact) or reliability (internal warpage prevention performance) of the semiconductor package 100*a*.

For example, the encapsulant 160 may contain a molding material such as an epoxy molding compound (EMC), but the present inventive concept is not limited thereto, and may contain an insulating material that may have protective properties or high ductility similar to those of the molding material. For example, the insulating material may be a build-up film (for example, an ABF), a thermosetting resin such as an epoxy resin, or a thermoplastic resin such as polyimide, and may be an insulating material in which an inorganic filler and/or a glass fiber are appropriately added to the insulating material of the first insulating layer 111.

Figure 1B:
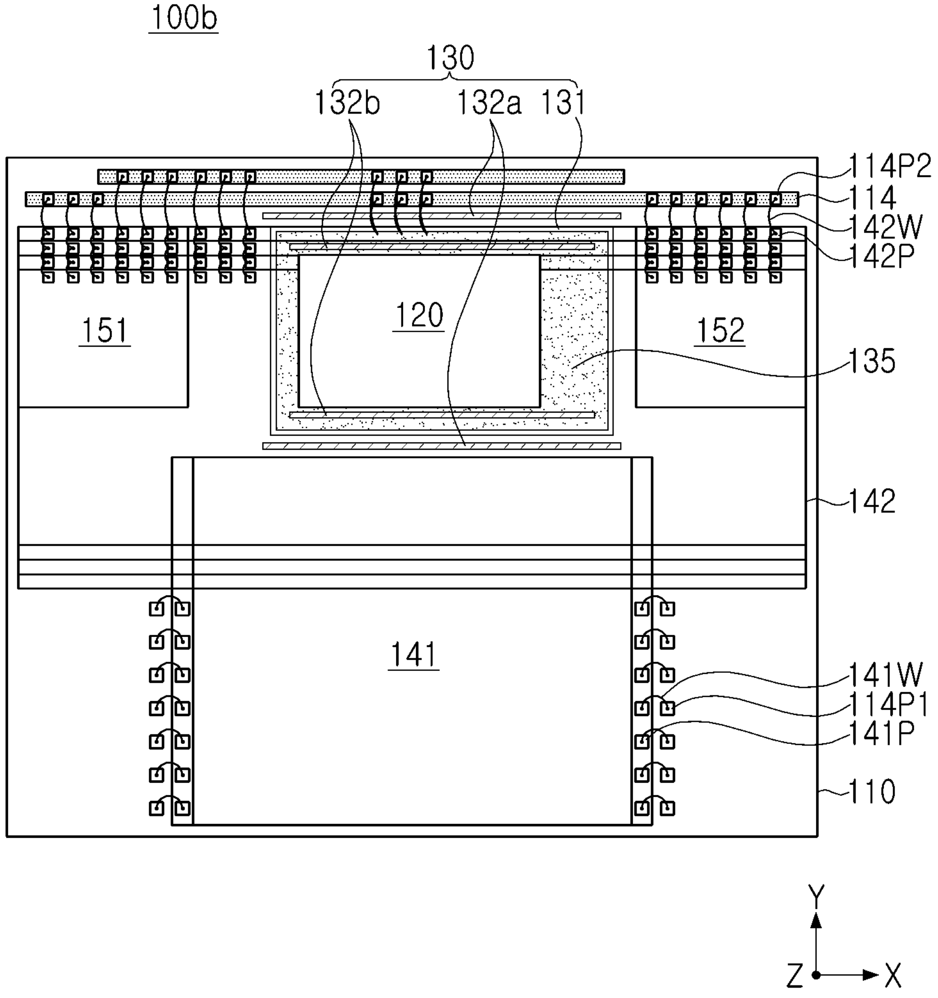

Referring to FIG. 1B, in a semiconductor package 100*b* according to an example embodiment of the present inventive concept, a portion 132*b* of trenches 132 may be recessed between a region overlapping a second semiconductor chip 141 and/or a region connected to wires and a dam 131, and the other portion 132*a* of the trenches 132 may be recessed between the semiconductor chip 120 and the dam 131. The dam 131 may protrude between the portion 132*b* and the other portion 132*a* of the trenches 132. The portion 132*b* of the trenches 132 may trap a portion of the non-conductive film layer 135 not blocked by the dam 131, thereby stably ensuring arrangement stability of the second semiconductor chip 141 and connection stability of wires 142W. The other portion 132*a* of the trenches 132 may have an effect of increasing an effective thickness of the dam 131, thereby further improving the performance of the dam 131 to block the non-conductive film layer 135.

For example, two 132*b* of at least four trenches 132 may be surrounded by the dam 131 and spaced apart from each other, and the other two 132*a* of the at least four trenches 132 may be spaced apart from each other without being surrounded by the dam 131. Accordingly, a flow direction of the non-conductive film layer 135 may be more concentrated in an X-direction than in a Y-direction, thereby more effectively suppressing overflow of the non-conductive film layer 135 into a region overlapping the second conductive chip 141 and/or a region 114 connected to the wires 142W.

Figure 1C:
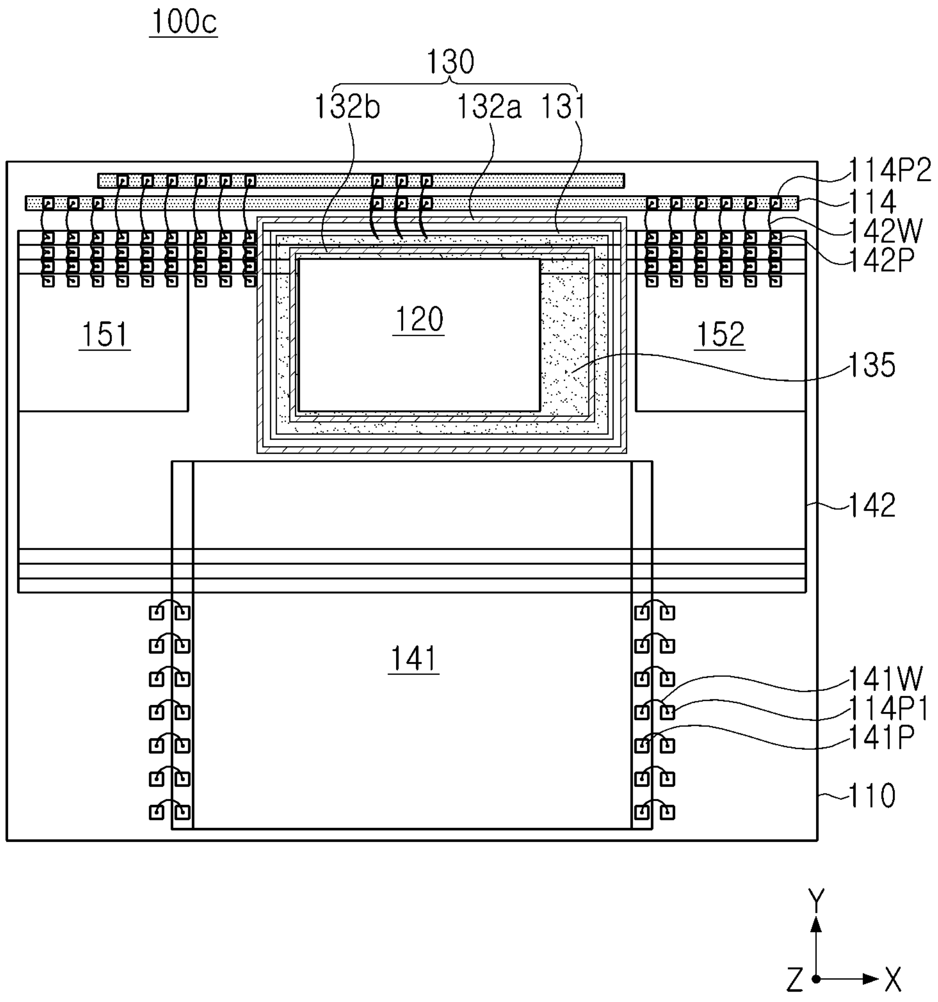

Referring to FIG. 1C, depending on design, trenches 132 of a semiconductor package 100*c* according to an example embodiment may also have an shape extending to surround a region overlapping the first semiconductor chip 120 and thus, the shape of the trenches 132 may be designed in various manners. Similarly, a shape of the dam 131 is not limited to a shape extending to surround a region overlapping the first semiconductor chip 120, and may have a straight linear shape.

Figure 1D:
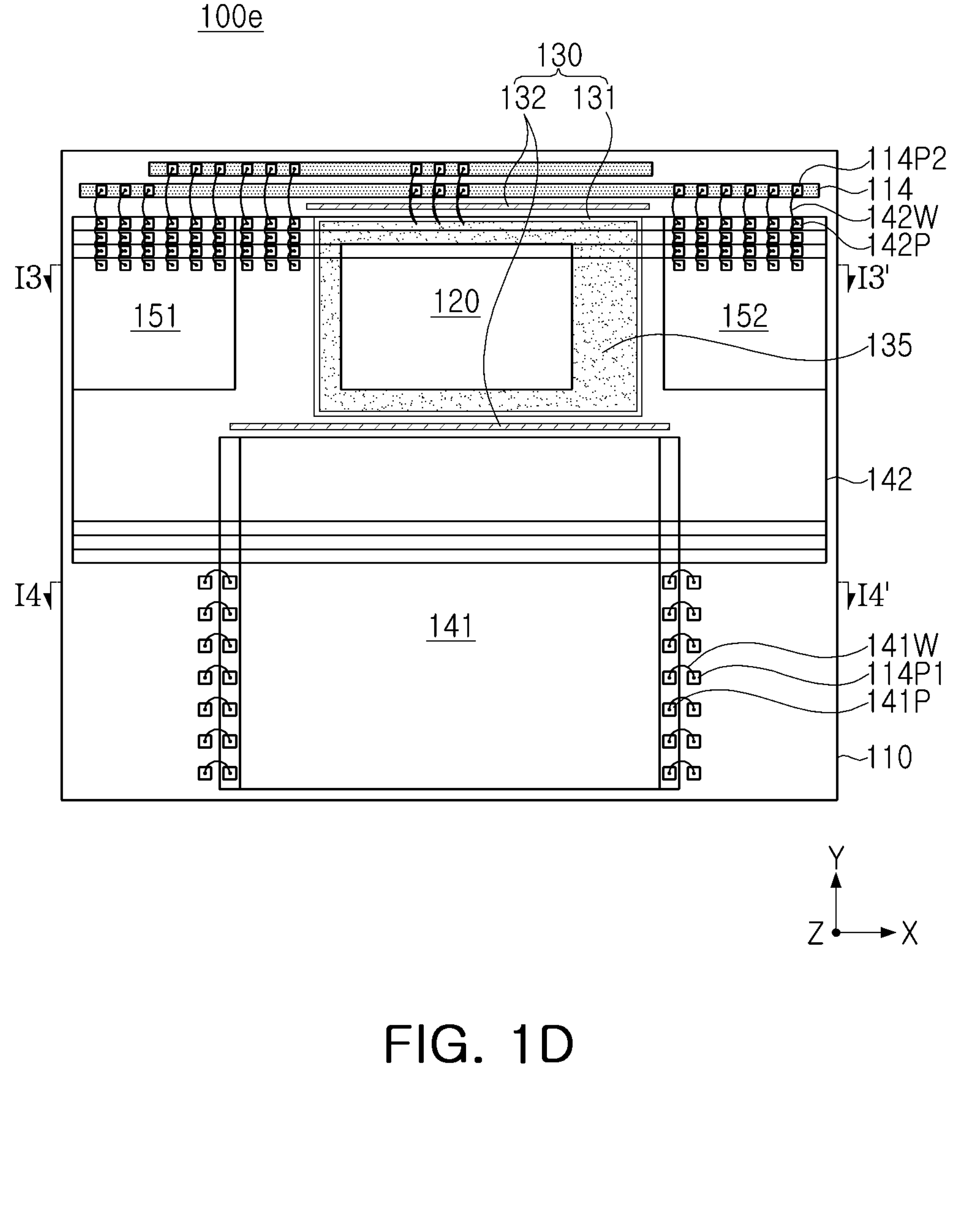

Referring to FIG. 1D, depending on design, a length of extension in one direction (for example, an X-direction) of at least one of the trenches 132 of a semiconductor package 100*e* according to an example embodiment of the present inventive concept may be greater than that of FIG. 1A. Accordingly, at least one of the trenches 132 may stably prevent a non-conductive film layer 135 from overflowing into a second semiconductor chip 141 even when the second semiconductor chip 141 has a large size, and the size of the second semiconductor chip 141 may have a higher degree of freedom.

For example, a length of extension in one direction (for example, the X-direction) of at least one of the trenches 132 may be greater than or equal to a length in the one direction (for example, the X-direction) of one of sub-semiconductor chips of the second semiconductor chip 141. For example, a difference between the length of extension in the one direction (for example, the X-direction) of at least one of the trenches 132 and a length of extension in the one direction (for example, the X-direction) of the dam 131 may be greater than a difference between the length of extension in the one direction (for example, the X-direction) of at least one of the trenches 132 and the length in the one direction (for example, the X-direction) of one of the sub semiconductor chips of the second semiconductor chip 141.

Figure 1E:
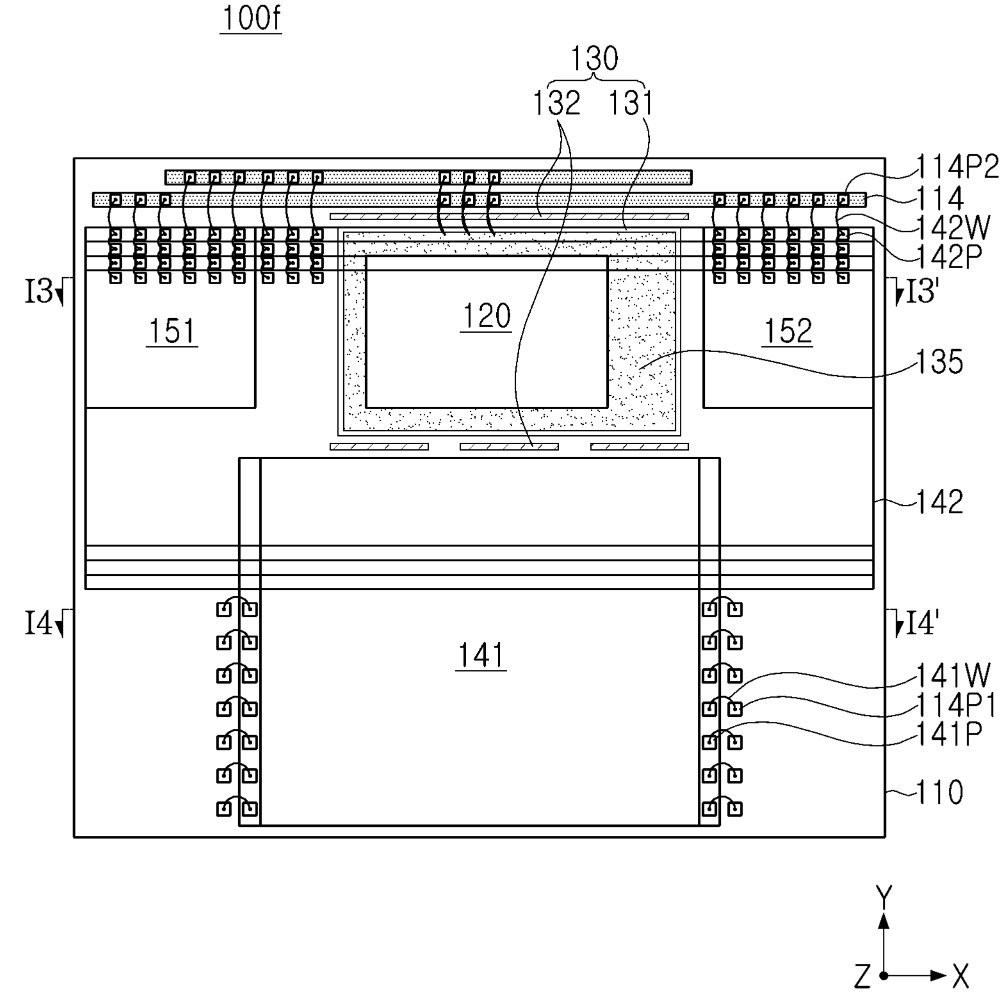

Referring to FIG. 1E, depending on design, at least one of the trenches 132 of a semiconductor package 100*f* according to an example embodiment of the present inventive concept may have a slit in which at least a portion of at least one of the trenches 132 extends in one direction, and then is disconnected. Accordingly, a range for preventing overflow of the non-conductive film layer 135 relative to a total length of extension in one direction (for example, an X-direction) of at least one of the trenches 132 may be effectively widened. Due to the slit, a length of continuous extension of each portion of the trenches 132 may decrease, and formation reliability (for example, reliability of a solder resist layer, support base stability of a dam, or the like) of the trenches 132 may be further improved.

Each of the slits may have a short length in one direction (for example, the X-direction) of, such that each of the slits may have little effect on the possibility that the non-conductive film layer 135 overflows into at least one of the trenches 132. For example, a length in the one direction (for example, the X-direction) of each of the slits may be 1% or more and 10% or less of a length of extension in the one direction (for example, the X-direction) of the dam 131, and a total length of the slits may be less than a total length of the trenches 132, but the present inventive concept is not limited thereto.

Figure 3:
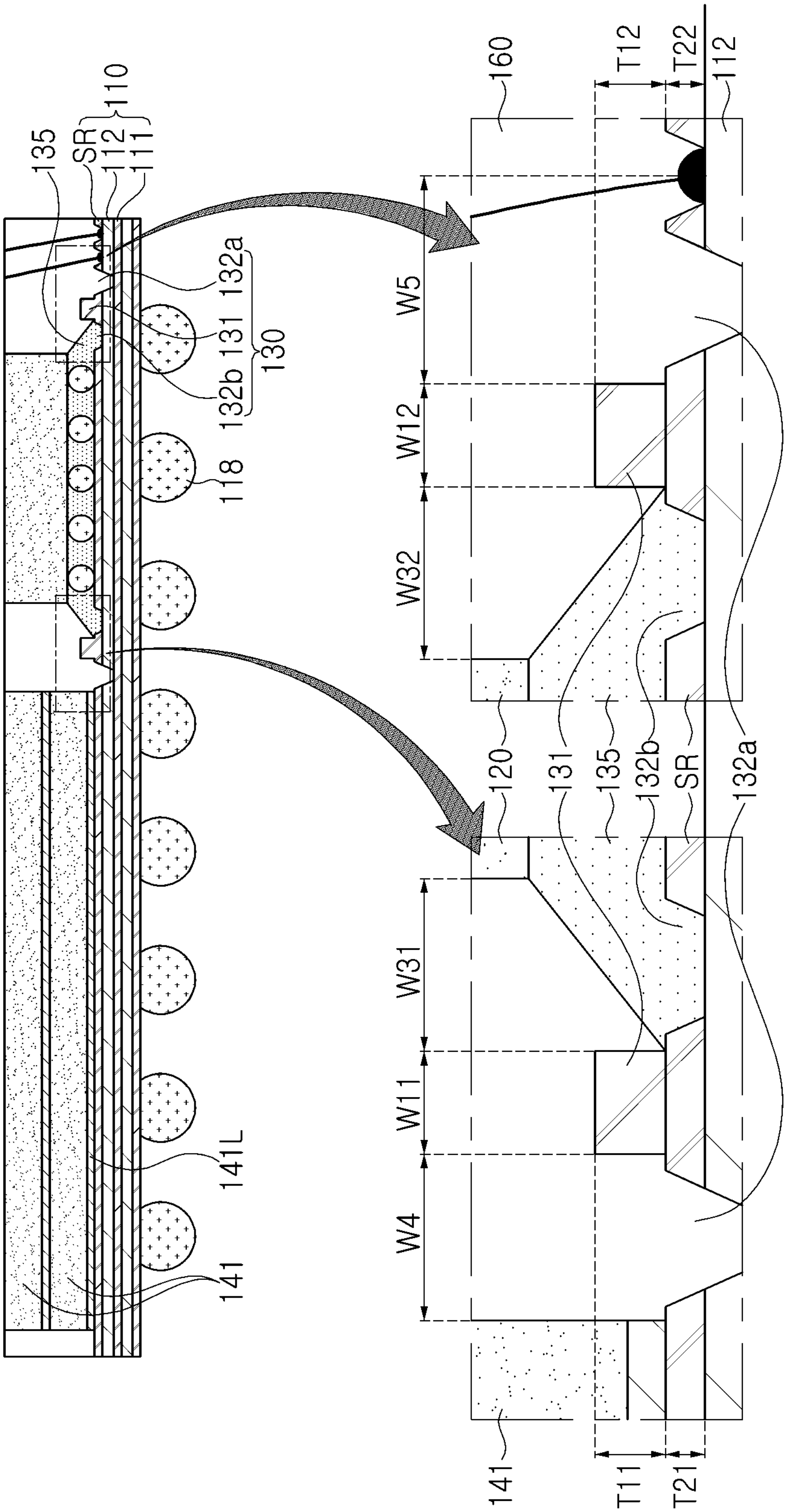
FIG. 3 is an enlarged cross-sectional view of a dam and a trench of a semiconductor package according to an example embodiment of the present inventive concept.

FIG. 3 is an enlarged cross-section of the semiconductor packages 100*b* and 100*c* of FIGS. 1B and 1C corresponding to the cross-section I1-I1' of FIG. 2A. Referring to FIGS. 1B, 1C, and 3, a distance W4 between a dam 131 and a second semiconductor chip 141 may be less than distances W31 and W32 between the dam 131 and a first semiconductor chip 120. Alternatively, the distance W4 between the other one 141 of second semiconductor chips and the dam 131 may be less than a distance W5 between a region 114 connected to wires and the dam 131. For example, the distance W4 may be 0.250 mm, the distances W31 and W32 and the distance W5 may each be 0.400 mm, and widths W11 and W12 of the dam 131 may be 0.100 mm. In such a structure, a combination of the dam 131 and a trench 132 may efficiently improve the performance of preventing overflow of a non-conductive film layer 135 in consideration of a flow pattern of the non-conductive film layer 135 according to an underfill process of the non-conductive film layer 135.

A solder resist layer SR may provide an upper surface of the substrate 110. The dam 131 may protrude from an upper surface of the solder resist layer SR. The trench 132 may have a shape in which the solder resist layer SR is recessed. An insulating material contained in the dam 131 may be the same as that of the solder resist layer SR, but the present inventive concept is not limited thereto.

A ratio of widths W11 and W12 and thicknesses T11 and T12 of the dam 131 may be within a range determined in consideration of material properties of the dam 131. Accordingly, when the thicknesses T11 and T12 of the dam 131 increase, the widths W11 and W12 of the dam 131 may also be widen. However, the widths W11 and W12 of the dam 131 may be further limited as a distance between a first semiconductor chip 120 and a second semiconductor chip 141 decreases or when a distance between the first semiconductor chip 120 and wires 142W decreases. Accordingly, the thicknesses T11 and T12 of the dam 131 may also be limited, and the performance of the dam 131 to prevent overflow of the non-conductive film layer 135 solely may also be limited. Here, at least one of the trenches 132 may effectively compensate for the limited performance of the dam 131.

A depth of the trench 132 may be equal to the thicknesses T21 and T22 of the solder resist layer SR. In order to extend the depth of the trench 132, the trench 132 may upwardly expose at least one insulating layer of the substrate 110. Accordingly, a volume of the trench 132 trapping the non-conductive film layer 135 may be increased, thereby further improving the performance of trapping the non-conductive film layer 135.

The encapsulant 160 or the non-conductive film layer 135 may be in direct contact with at least one insulating layer of the substrate 110 through the trench 132. The adhesion between the at least one insulating layer of the substrate 110 (for example, prepreg) and the encapsulant 160 may be stronger than the adhesion between the solder resist layer SR and the encapsulant 160, such that overall durability and reliability of the semiconductor packages 100*b* and 100*c* may be further improved.

Figure 4A:
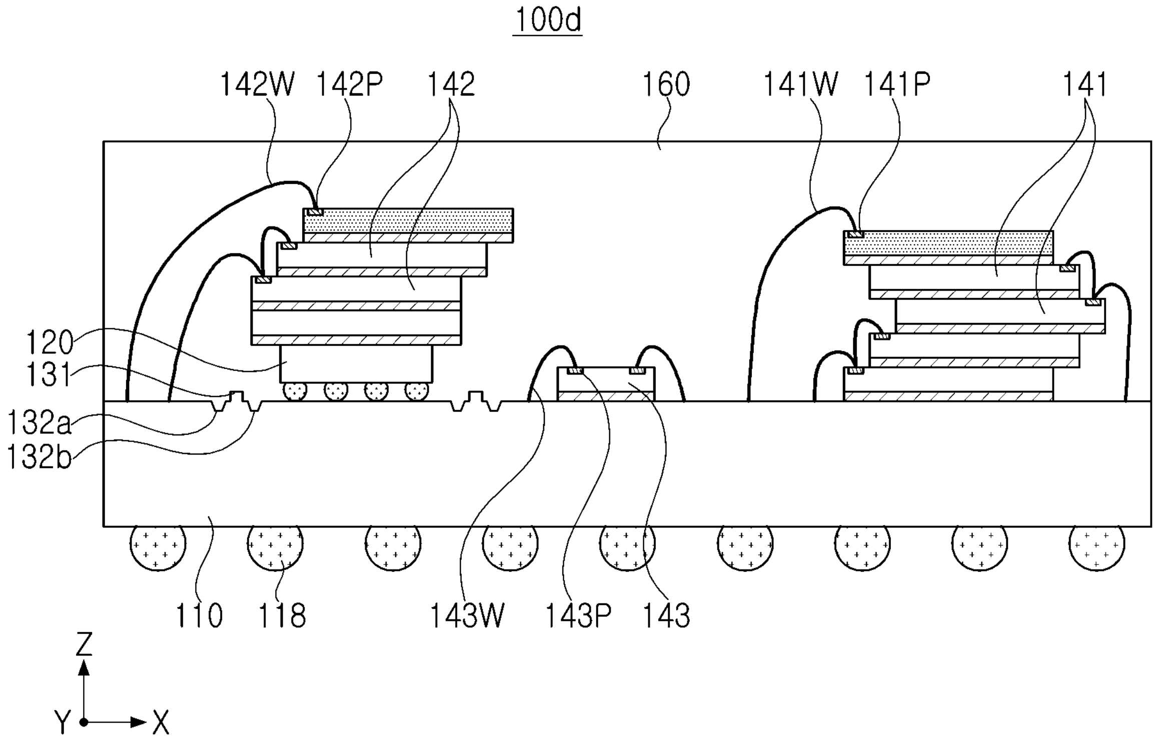
FIG. 4A is a cross-sectional view of a structure in which arrangements of second semiconductor chips of a semiconductor package according to an example embodiment are changed.
Figure 4B:
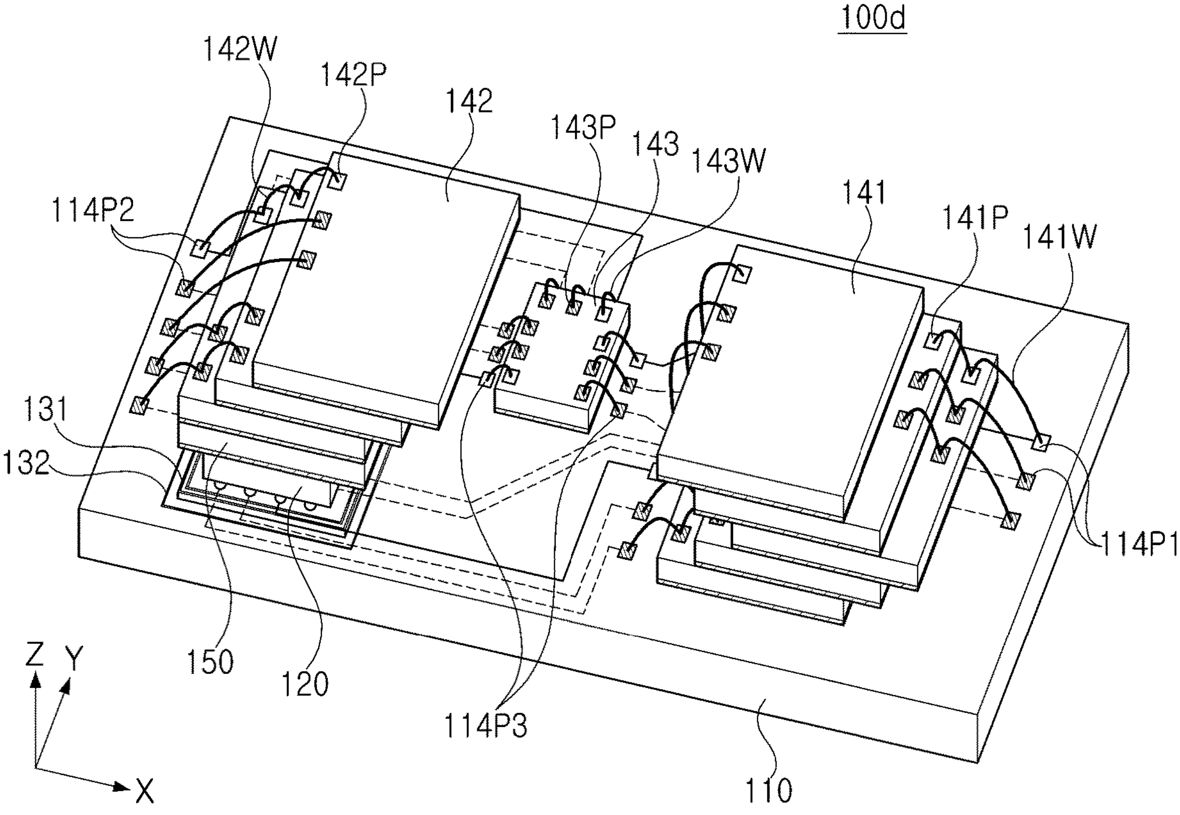
FIG. 4B is a perspective view of a structure in which arrangements of second semiconductor chips of a semiconductor package according to an example embodiment are changed.

Referring to FIGS. 4A and 4B, a semiconductor package 100*d* according to an example embodiment may include at least one of second semiconductor chips 141, 142, and 143 and a first semiconductor chip 120. A dam 131 may surround a region overlapping the first semiconductor chip 120 on an upper surface of a substrate 110, and trenches 132, 132*a*, and 132*b* may be disposed to oppose wire bonding pads 114P2 and 114P3 in a direction (X-direction) in which the first semiconductor chip 120 opposes the wire bonding pads 114P2 and 114P3 and the second semiconductor chip 143. Accordingly, a combination of the dam 131 and the trenches 132, 132*a*, and 132*b* may improve connection stability of wires 142W and 143W or improve arrangement stability of the second semiconductor chip 143.

For example, the second semiconductor chip 143 may also have second semiconductor chip pads 143P, and the wires 143W may connect between the second semiconductor chip pads 143P and wire bonding pads 114P3. The first semiconductor chip 120 and the second semiconductor chips 141 and 143 may be electrically connected to each other through an interconnection of at least one interconnection layer of the substrate 110. A specific arrangement position of second semiconductor chip pads 141P and 142P on upper surfaces of sub-semiconductor chips of each of the second semiconductor chips 141 and 142 may vary depending on design.

According to example embodiments of the present inventive concept, a semiconductor package may efficiently improve performance relative to a unit size and ensure durability and/or reliability.

While example embodiments have been illustrated and described above, it will be apparent to those skilled in the art that modifications and variations could be made without departing from the scope of the present inventive concept as defined by the appended claims.

What is claimed is:

1. A semiconductor package comprising:

a substrate;

a first semiconductor chip on an upper surface of the substrate;

electrically conductive bumps extending between and electrically connected to the substrate and the first semiconductor chip;

a non-conductive film layer having at least a portion extending between the electrically conductive bumps;

a second semiconductor chip extending on the upper surface of the substrate; and electrically conductive wires that electrically connect respective portions of the second semiconductor chip to respective portions of the upper surface of the substrate;

wherein the upper surface of the substrate includes a dam, which protrudes between one of: (i) a region overlapping the second semiconductor chip, and (ii) a region connected to the wires and a region overlapping the first semiconductor chip;

wherein the upper surface of the substrate further includes a trench recessed alongside at least a portion of the dam;

wherein the second semiconductor chip is attached to the upper surface of the substrate, wherein at least a portion of the dam and at least a portion of the trench overlap a space between the first and second semiconductor chips, and wherein a distance between the dam and the second semiconductor chip is less than a distance between the dam and the first semiconductor chip.

2. The semiconductor package of claim 1, wherein the second semiconductor chip extends on an upper surface of the first semiconductor chip;

wherein at least a portion of the dam protrudes between the region connected to the wires and the region overlapping the first semiconductor chip; and wherein at least a portion of the trench is recessed between the region connected to the wires and the region overlapping the first semiconductor chip.

3. The semiconductor package of claim 1, wherein the second semiconductor chip is attached to the upper surface of the substrate through an adhesive film.

4. The semiconductor package of claim 1, wherein at least a portion of the trench is recessed between the region overlapping the second semiconductor chip and the dam.

5. The semiconductor package of claim 1, wherein the trench includes trenches; and wherein at least a portion of the dam protrudes between the trenches.

6. The semiconductor package of claim 1, wherein the dam has a shape that at least partially surrounds the region overlapping the first semiconductor chip; and wherein the trench has a shape extending partially alongside a portion of the dam.

7. The semiconductor package of claim 1, wherein the substrate includes a solder resist layer on the upper surface of the substrate; wherein the dam protrudes from an upper surface of the solder resist layer; and wherein the trench has a shape in which the solder resist layer is recessed.

8. The semiconductor package of claim 7, wherein the substrate has a structure in which at least one interconnection layer and at least one insulating layer are alternately stacked on a lower side of the solder resist layer; and wherein the trench upwardly exposes the at least one insulating layer.

9. The semiconductor package of claim 8, further comprising:

an encapsulant, which seals the first and second semiconductor chips; and wherein at least one of the encapsulant and the non-conductive film layer is in direct contact with the at least one insulating layer.

10. The semiconductor package of claim 1, wherein the second semiconductor chip includes a plurality of second semiconductor chips; wherein the first semiconductor chip extends between a portion of one of the second semiconductor chips and the substrate; and wherein another one of the second semiconductor chips extends between the other portion of one of the second semiconductor chips and the substrate.

11. A semiconductor package, comprising:

a substrate;

a first semiconductor chip extending on an upper surface of the substrate;

electrically conductive bumps extending between and connected to the substrate and the first semiconductor chip;

a non-conductive film layer having at least a portion extending between the electrically conductive bumps;

second semiconductor chips extending on the upper surface of the substrate; and electrically conductive wires connecting one of the second semiconductor chips and the upper surface of the substrate; and wherein the upper surface of the substrate includes a dam protruding between a region vertically overlapping another one of the second semiconductor chips and a region vertically overlapping the first semiconductor chip, and protruding between a region connected to the wires and the region vertically overlapping the first semiconductor chip; and wherein the upper surface of the substrate further includes a trench recessed alongside at least a portion of the dam.

12. The semiconductor package of claim 11, wherein the one of the second semiconductor chips extends on an upper surface of the first semiconductor chip; and wherein the other one of the second semiconductor chips is attached to the upper surface of the substrate through an adhesive film.

13. The semiconductor package of claim 12, wherein the dam has a shape that at least partially surrounds the region vertically overlapping the first semiconductor chip; and wherein at least a portion of the trench is recessed between the region vertically overlapping the other one of the second semiconductor chips and the dam, and is recessed between the region connected to the wires and the dam.

14. The semiconductor package of claim 13, wherein the trench includes at least four trenches, with two of the trenches surrounded by the dam and spaced apart from each other, and another two of the trenches spaced apart from each other without being surrounded by the dam.

15. The semiconductor package of claim 14, further comprising:

an encapsulant that seals the first semiconductor chip and the second semiconductor chips;

wherein the substrate includes a solder resist layer on the upper surface of the substrate, and has a structure in which at least one interconnection layer and at least one insulating layer are alternately stacked on a lower side of the solder resist layer;

wherein the dam protrudes from an upper surface of the solder resist layer; and wherein the encapsulant or the non-conductive film layer is in direct contact with the at least one insulating layer through the trench.

16. A semiconductor package, comprising:

a substrate;

first and second semiconductor chips extending on an upper surface of the substrate;

electrically conductive bumps extending between and connected to the substrate and the first semiconductor chip; and a non-conductive film layer having at least a portion extending between the electrically conductive bumps;

wherein the upper surface of the substrate includes a dam, which protrudes and has a shape extending to surround a region overlapping the first semiconductor chip, and a trench that is recessed and has a shape extending partially alongside portion of the dam, and wherein the trench includes at least four trenches, with two of the trenches surrounded by the dam and spaced apart from each other, and another two of the trenches are spaced apart from each other without being surrounded by the dam.

17. The semiconductor package of claim 16, wherein the trench has a slit in which at least a portion of the trench extends in one direction and is then disconnected.

18. The semiconductor package of claim 16, further comprising:

an encapsulant sealing the first semiconductor chip; and wherein the substrate includes a solder resist layer on the upper surface of the substrate, and has a structure in which at least one interconnection layer and at least one insulating layer are alternately stacked on a lower side of the solder resist layer;

wherein the dam protrudes from an upper surface of the solder resist layer; and wherein the encapsulant or the non-conductive film layer is in direct contact with the at least one insulating layer through the trench.

19. The semiconductor package of claim 1, wherein the dam includes a first portion and a second portion, and wherein the trench is recessed alongside the first portion of the dam and disconnected from the second portion of the dam.

* * * * *